(12) United States Patent
Van Weperen et al.

(10) Patent No.: US 12,140,875 B2
(45) Date of Patent: Nov. 12, 2024

(54) METROLOGY MEASUREMENT METHOD AND APPARATUS

(71) Applicant: ASML Netherlands B.V., Veldhoven (NL)

(72) Inventors: Ilse Van Weperen, Son en Breugel (NL); Han-Kwang Nienhuys, Utrecht (NL); Teis Johan Coenen, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 153 days.

(21) Appl. No.: 17/910,118

(22) PCT Filed: Mar. 3, 2021

(86) PCT No.: PCT/EP2021/055316
§ 371 (c)(1),
(2) Date: Sep. 8, 2022

(87) PCT Pub. No.: WO2021/180540
PCT Pub. Date: Sep. 16, 2021

(65) Prior Publication Data
US 2023/0100123 A1    Mar. 30, 2023

(30) Foreign Application Priority Data
Mar. 11, 2020 (EP) .................... 20162286

(51) Int. Cl.
*G03F 7/00* (2006.01)
*G01B 11/27* (2006.01)
*G01B 15/00* (2006.01)

(52) U.S. Cl.
CPC ............ *G03F 7/7085* (2013.01); *G01B 11/27* (2013.01); *G01B 15/00* (2013.01); *G03F 7/70633* (2013.01)

(58) Field of Classification Search
CPC ............... G03F 7/7085; G03F 7/70633; G03F 7/70641; G01B 11/27; G01B 15/00
See application file for complete search history.

(56) References Cited

U.S. PATENT DOCUMENTS 6,952,253 B2   10/2005   Lof et al.
7,005,649 B1 *  2/2006   Tezuka .................. G01N 21/47
                                              250/372

(Continued)

FOREIGN PATENT DOCUMENTS

CN      101515105 B    8/2009
EP      1628164 A2     2/2006

(Continued)

OTHER PUBLICATIONS

International Search Report and Written Opinion of the International Searching Authority directed to related International Patent Application No. PCT/EP2021/055316, mailed Jun. 11, 2021; 10 pages.

(Continued)

*Primary Examiner* — Kiho Kim
(74) *Attorney, Agent, or Firm* — Sterne, Kessler, Goldstein & Fox P.L.L.C.

(57) ABSTRACT

Methods and apparatus for determining a parameter of a structure fabricated in or on a substrate and compensated for a drift error. The methods comprising: illuminating, at a plurality of times, at least part of the structure with electromagnetic radiation, the at least part of the structure being at a first orientation; sensing, at the plurality of times, a plurality of average reflectances of the at least part of the structure; and determining, based on the plurality of average reflectances, an estimation of the parameter at one or more further times.

15 Claims, 6 Drawing Sheets

(56) References Cited

U.S. PATENT DOCUMENTS

| | | |
|---|---|---|
| 7,428,044 B2 | 9/2008 | Vuong et al. |
| 7,829,852 B2 | 11/2010 | Cao et al. |
| 7,838,185 B2 | 11/2010 | Ide et al. |
| 9,316,492 B2 | 4/2016 | Peterson et al. |
| 2002/0013007 A1 | 1/2002 | Hasegawa et al. |
| 2006/0066855 A1 | 3/2006 | Boef et al. |
| 2007/0224518 A1 | 9/2007 | Yokhin et al. |
| 2007/0296960 A1 | 12/2007 | Den Boef et al. |
| 2008/0117437 A1 | 5/2008 | Vuong et al. |
| 2008/0198380 A1 | 8/2008 | Straaijer et al. |
| 2008/0239318 A1 | 10/2008 | Den Boef et al. |
| 2008/0246966 A1 | 10/2008 | Oomori et al. |
| 2009/0168062 A1 | 7/2009 | Straaijer |
| 2010/0007863 A1 | 1/2010 | Jordanoska |
| 2010/0328655 A1 | 12/2010 | Den Boef |
| 2011/0026032 A1 | 2/2011 | Den Boef et al. |
| 2011/0032500 A1 | 2/2011 | Straaijer |
| 2011/0102753 A1 | 5/2011 | Van De Kerkhof et al. |
| 2011/0102793 A1 | 5/2011 | Straaijer |
| 2011/0188020 A1 | 8/2011 | Den Boef |
| 2011/0249244 A1 | 10/2011 | Leewis et al. |
| 2012/0044470 A1 | 2/2012 | Smilde et al. |
| 2012/0044495 A1 | 2/2012 | Straaijer |
| 2012/0182542 A1 | 7/2012 | Walsh et al. |
| 2013/0162996 A1 | 6/2013 | Straaijer et al. |
| 2013/0304424 A1 | 11/2013 | Bakeman et al. |
| 2013/0308142 A1 | 11/2013 | Straaijer |
| 2014/0019097 A1 | 1/2014 | Bakeman et al. |
| 2016/0161863 A1 | 6/2016 | Den Boef et al. |
| 2016/0282282 A1 | 9/2016 | Quintaniha et al. |
| 2016/0370717 A1 | 12/2016 | Den Boef et al. |
| 2017/0184981 A1 | 6/2017 | Quintaniha et al. |
| 2017/0315055 A1 | 11/2017 | Tinnemans et al. |
| 2019/0003988 A1 | 1/2019 | Solarz et al. |
| 2019/0215940 A1 | 7/2019 | Khodykin et al. |
| 2024/0019097 A1 | 1/2024 | Bakeman et al. |

FOREIGN PATENT DOCUMENTS

| | | |
|---|---|---|
| JP | 2012172999 A | 9/2012 |
| TW | 200741199 A | 11/2007 |
| WO | WO 2011/012624 A1 | 2/2011 |

OTHER PUBLICATIONS

Lemaillet et al, "Intercomparison between optical and X-ray scatterometry measurements of FinFET structures", Proceedings of SPIE—The International Society for Optical Engineering, Apr. 2013, 8 pages.

International Search Report and Written Opinion of the International Searching Authority directed to related International Patent Application No. PCT/EP2021/054953, mailed Jun. 11, 2021; 10 pages.

\* cited by examiner

METROLOGY MEASUREMENT METHOD AND APPARATUS

CROSS REFERENCE TO RELATED APPLICATIONS

This application claims priority of EP application 20162286.7 which was filed on 2020 Mar. 11 and which is incorporated herein in its entirety by reference.

FIELD

The present invention relates to methods and apparatus for use in measuring parameters of a structure fabricated in or on a substrate. Specific arrangements may relate to, but need not be limited to, measurement of overlay or critical dimension.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field.

Examples of known scatterometers often rely on provision of dedicated metrology targets. For example, a method may require a target in the form of a simple grating that is large enough that a measurement beam generates a spot that is smaller than the grating (i.e., the grating is underfilled). In a reconstruction method, properties of the grating can be calculated by simulating interaction of scattered radiation with a mathematical model of the target structure. Parameters of the model are adjusted until the simulated interaction produces a diffraction pattern similar to that observed from the real target.

In addition to measurement of feature shapes by reconstruction, diffraction-based overlay can be measured using such apparatus, as described in published patent application US2006066855A1. Diffraction-based overlay metrology using dark-field imaging of the diffraction orders enables overlay measurements on smaller targets. These targets can be smaller than the illumination spot and may be surrounded by product structures on a wafer. Examples of dark field imaging metrology can be found in numerous published patent applications, such as for example US2011102753A1 and US20120044470A. Multiple gratings can be measured in one image, using a composite grating target. The known scatterometers tend to use light in the visible or near-IR wave range, which requires the pitch of the grating to be much coarser than the actual product structures the properties of which are actually of interest. Such product features may be defined using deep ultraviolet (DUV), extreme ultraviolet (EUV) or X-ray radiation having far shorter wavelengths. Unfortunately, such wavelengths are not normally available or usable for metrology.

On the other hand, the dimensions of modern product structures are so small that they cannot be imaged by optical metrology techniques. Small features include for example those formed by multiple patterning processes, and/or pitch-multiplication. Hence, targets used for high-volume metrology often use features that are much larger than the products for which overlay errors or critical dimensions are the property of interest. The measurement results are only indirectly related to the dimensions of the real product structures, and may be inaccurate because the metrology target does not suffer the same distortions under optical projection in the lithographic apparatus, and/or different processing in other steps of the manufacturing process. While scanning electron microscopy (SEM) is able to resolve these modern product structures directly, SEM is much more time consuming than optical measurements. Moreover, electrons are not able to penetrate through thick process layers, which makes them less suitable for metrology applications. Other techniques, such as measuring electrical properties using contact pads is also known, but it provides only indirect evidence of the true product structure.

By decreasing the wavelength of the radiation used during metrology (i.e. moving towards e.g. the "soft X-ray" wavelength spectrum), it is possible to resolve smaller structures, to increase sensitivity to structural variations of the structures and/or penetrate further into the product structures. One such method of generating suitably high frequency radiation (e.g., hard X-ray and/or soft X-ray and/or EUV radiation) may be using a pump radiation (e.g., infra-red radiation) to excite a generating medium, thereby generating an emitted radiation, optionally a high harmonic generation comprising high frequency radiation.

In specific known arrangements, overlay metrology can be performed by illuminating, using electromagnetic radiation, an overlay target or other structure and measuring radiation diffracted or reflected from the overlay target. The target may comprise two gratings on top of each other. Asymmetry in the diffracted radiation is defined as the difference between an intensity of the negative and corresponding positive diffraction orders, for example the difference between the $-1^{st}$ and $+1^{st}$ diffraction orders. This asymmetry is dependent on the lateral shift (the overlay shift) between the top and bottom grating of the overlay target. The asymmetry of an overlay grating thus allows evaluation of overlay.

As used herein, the term "intensity" encompasses incident power (in watts) of radiation, which may be SXR radiation, per unit area. In exemplary arrangements disclosed, the area may be detector or sensor area. The term "signal" encompasses an electrical charge collected by a detector (or sensor) pixel during an exposure. The signal may be expressed in coulombs or in analog-digital units (ADU). The signal is proportional to irradiance and exposure time (the proportionality constant is wavelength dependent). The term "reflectance" encompasses the ratio of diffracted spectral flux to spectral flux incident upon a target. The reflectance may depend on the target properties, target orientation, the wavelength, and/or the diffraction order number. The reflectance of a target may vary (drift) over time. Reflectance may be measured as an average over an exposure time.

Such evaluation typically requires calibration of the relation between asymmetry and overlay (in other words, the extraction of the sensitivity of overlay to asymmetry). This can be done using measurements on multiple overlay targets with known overlay shifts (overlay biases). One exemplary calibration method uses measurements on two overlay targets with different overlay shift to extract overlay (and the sensitivity).

In the absence of system (or tool) asymmetries (e.g. sensor asymmetries) a single measurement of the diffracted radiation from a target suffices for overlay extraction. System asymmetry (e.g. a different gain of the detector for the $-1^{st}$ order compared to the $1^{st}$ order) adds non-overlay asymmetry to the asymmetry determined based on the diffracted radiation. To remove this tool-induced asymmetry a second measurement on the same target is done after the target has been rotated in-plane by 180 degrees. The first measurement is referred to as the nominal target orientation measurement, the second one as the rotated target orientation measurement. The rotated measurement results in diffracted radiation from the target that is also rotated. However, a tool-induced asymmetry will not be rotated. Thus, the combination of nominal and rotated measurement allows distinction of overlay asymmetry from system asymmetry.

Generally the (components of a) metrology tool may drift over time, e.g. due to thermal effects. Drift may affect the intensity of diffracted light and possibly the asymmetry. This is referred to as tool drift.

SUMMARY

Methods and apparatus disclosed herein are aimed at solving one or more problems in the art.

In particular, it is advantageous to extract overlay (using the method outlined above) from overlay targets of which the grating width is similar to the critical dimensions of the stack. A promising method to do this is to use hard X-ray (HXR) radiation, soft X-ray (SXR) radiation or using EUV radiation (e.g. with a wavelength in a range from 10-20 nm). However, reaction of e.g. the SXR or extreme ultraviolet (EUV) radiation with hydrocarbons is expected to lead to material deposition, e.g. carbon deposition, on the targets during their exposure.

It is also advantageous to measure overlay on after-development inspection (ADI) targets, on which the top grating exists in developed photoresist only. However, the exposure of such ADI targets to e.g. SXR or EUV radiation leads to exposure of the resist, which is expected to result in changes of the resist, in particular to shrinkage of the resist.

Material deposition optionally carbon deposition, resist shrinkage and/or other error sources may be termed target drift errors. Current methods of determining parameters, such as overlay, are not sensitive to these target drift errors. Target drift (e.g. the structural change of the target due to illumination) affects the intensity of the $-1^{st}$ and $+1^{st}$ (or higher order) diffraction orders, and may therefore affect asymmetry. If asymmetry is affected, this will in turn affect (e.g. deteriorate) the accuracy of determined overlay. Determined overlay may therefore be different to the actual overlay due to target drift. For this reason methods to compensate for a drift error in determining overlay, or in general a parameter of a structure, are desired.

According to an aspect of the invention, there is provided a method of determining a parameter of a structure fabricated in or on a substrate and compensated for a drift error, the method comprising: illuminating, at a plurality of times, at least part of the structure with electromagnetic radiation, the at least part of the structure being at a first orientation; sensing, at the plurality of times, a plurality of average reflectances of the at least part of the structure, wherein the average reflectances are indicative of the parameter at the plurality of times; illuminating, at one or more further times, the at least part of the structure with electromagnetic radiation, the at least part of the structure being at a second orientation; and sensing, at the one or more further times, one or more further average reflectances of the at least part of the structure, wherein the further average reflectances are indicative of the parameter at the one or more further times; and determining, based on the plurality of average reflectances and the one or more further average reflectances, an estimation of the parameter at the one or more further times.

Optionally, the method further comprises estimating the drift error based on the plurality of average reflectances.

Optionally, in the second orientation, the at least part of the structure is rotated about a z-axis that is perpendicular to a plane of the substrate, the rotation being relative to a source of the electromagnetic radiation, and optionally wherein the rotation is one of 180 degrees and 90 degrees.

Optionally, the one or more further times is a plurality of further times.

Optionally, determining the estimation of the parameter is further based on a total radiation dose associated with the illumination of the at least part of the structure at the first orientation, and a total radiation dose associated with the illumination of the at least part of the structure at the second orientation.

Optionally, the total radiation dose associated with the illumination of the at least part of the structure at the first orientation is substantially equal to the total radiation dose associated with the illumination of the at least part of the structure at the second orientation.

Optionally, the plurality of average reflectances and/or the further average reflectances comprise an integration of a radiation intensity over at least part of an illumination time.

Optionally, determination of the estimation of the parameter is further based on a linear relationship between the drift error and illumination time of the at least part of the structure.

Optionally, the method further comprises determining a rate of change of the drift error for determining an estimation of the parameter for one or more structures fabricated in or on one or more further substrates.

Optionally, determination of the estimation of the parameter is further based on a relationship between the drift error and illumination time of the at least part of the structure that comprises one or more polynomial functions.

Optionally, determining the estimation of the parameter comprises determining a weighted average of the plurality of average reflectances.

Optionally, determining the estimation of the parameter comprises determining a weighted average of the plurality of further average reflectances.

Optionally, weights applied when determining the weighted average are determined based on a time between illuminations of the at least part of the structure.

Optionally, illumination at the plurality of times comprises: illumination, at a first time, of at least part of a first structure; illumination, at a second time, of at least part of a second structure; and illumination, at a third time, of at least part of the first structure, wherein the plurality of average reflectances are indicative of the parameter at the first, second and third times.

Optionally, determining an estimation of the parameter comprises determining an estimation of target drift and/or an estimation of system drift based on the plurality of average reflectances.

Optionally, determining an estimation of the system drift is based on a diffracted radiation intensity corresponding to illumination of the first structure at the first time and a diffracted radiation intensity corresponding to illumination of the second structure at the second time.

Optionally, determining an estimation of the target drift is based on a diffracted radiation intensity corresponding to illumination of the first structure at the first time and a diffracted radiation intensity corresponding to illumination of the first structure at the third time.

Optionally, the electromagnetic radiation for illumination of the at least part of the structure in the first orientation is one of p-polarized and s-polarized electromagnetic radiation.

Optionally, the electromagnetic radiation for illumination of the at least part of the structure in the second orientation is the other of p-polarized and s-polarized electromagnetic radiation.

Optionally, the electromagnetic radiation for illumination of the at least part of the structure in the first orientation comprises electromagnetic radiation in a first spectrum, and wherein the electromagnetic radiation for illumination of the at least part of the structure in the second orientation comprises electromagnetic radiation in a second spectrum.

Optionally, the structure comprises a metrology target.

Optionally, the parameter comprises overlay.

Optionally, the electromagnetic radiation comprises electromagnetic radiation having a wavelength in a range from 0.1 nm to 100 nm.

According to an aspect of the invention, there is provided a computer program product comprising instructions which, when executed on at least one processor, cause the at least one processor to control an apparatus to carry out a method according to any described herein.

According to an aspect of the invention, there is provided an apparatus for determining a parameter of a structure fabricated in or on a substrate and compensated for a drift error, the apparatus comprising a computer processor configured to control the apparatus to undertake the method of: illuminating, at a plurality of times, at least part of the structure with electromagnetic radiation, the at least part of the structure being at a first orientation; sensing, at the plurality of times, a plurality of average reflectances of the at least part of the structure, wherein the average reflectances are indicative of the parameter at the plurality of times; illuminating, at one or more further times, the at least part of the structure with electromagnetic radiation, the at least part of the structure being at a second orientation; and sensing, at the one or more further times, one or more further average reflectances of the at least part of the structure, wherein the further average reflectances are indicative of the parameter at the one or more further times; and determining, based on the plurality of average reflectances and the one or more further average reflectances, an estimation of the parameter at the one or more further times.

According to an aspect of the invention, there is provided a metrology tool comprising an apparatus according to clause 25.

According to an aspect of the invention, there is provided a lithographic system comprising a metrology tool according to clause 26.

According to an aspect of the invention, there is provided a lithographic cell comprising a lithographic system according to clause 27.

According to an aspect of the invention, there is provided a method of determining a parameter of a structure fabricated in or on a substrate and compensated for a drift error, the method comprising: illuminating, at a plurality of times, at least part of the structure with electromagnetic radiation, the at least part of the structure being at a first orientation; sensing, at the plurality of times, a plurality of average reflectances of the at least part of the structure, wherein the average reflectances are indicative of the parameter at the plurality of times; and determining, based on the plurality of average reflectances, an estimation of the parameter at one or more further times.

According to an aspect of the invention, there is provided an apparatus for determining a parameter of a structure fabricated in or on a substrate and compensated for a drift error, the apparatus comprising a computer processor configured to control the apparatus to undertake the method of: illuminating, at a plurality of times, at least part of the structure with electromagnetic radiation, the at least part of the structure being at a first orientation; sensing, at the plurality of times, a plurality of average reflectances of the at least part of the structure, wherein the average reflectances are indicative of the parameter at the plurality of times; and determining, based on the plurality of average reflectances, an estimation of the parameter at one or more further times.

BRIEF DESCRIPTION OF THE DRAWINGS

Embodiments will now be described, by way of example only, with reference to the accompanying schematic drawings, in which.

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
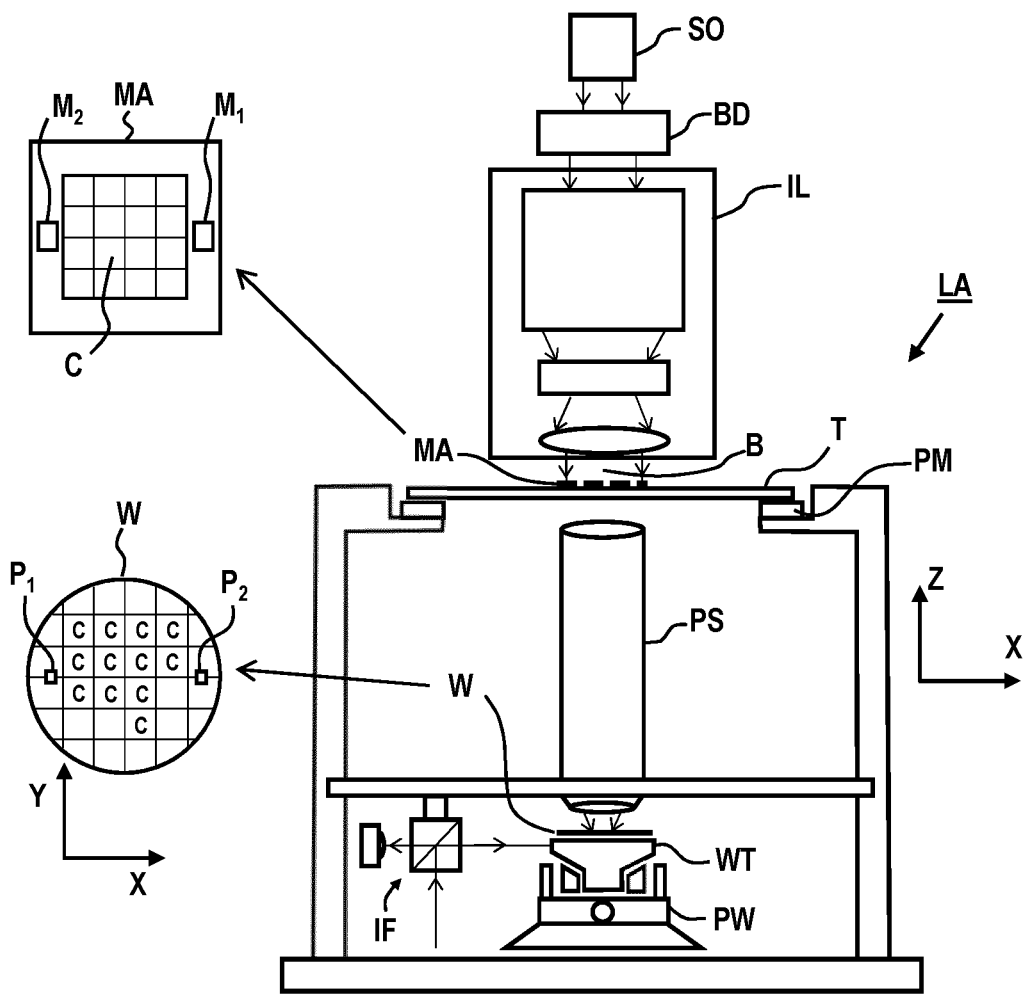
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT may be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
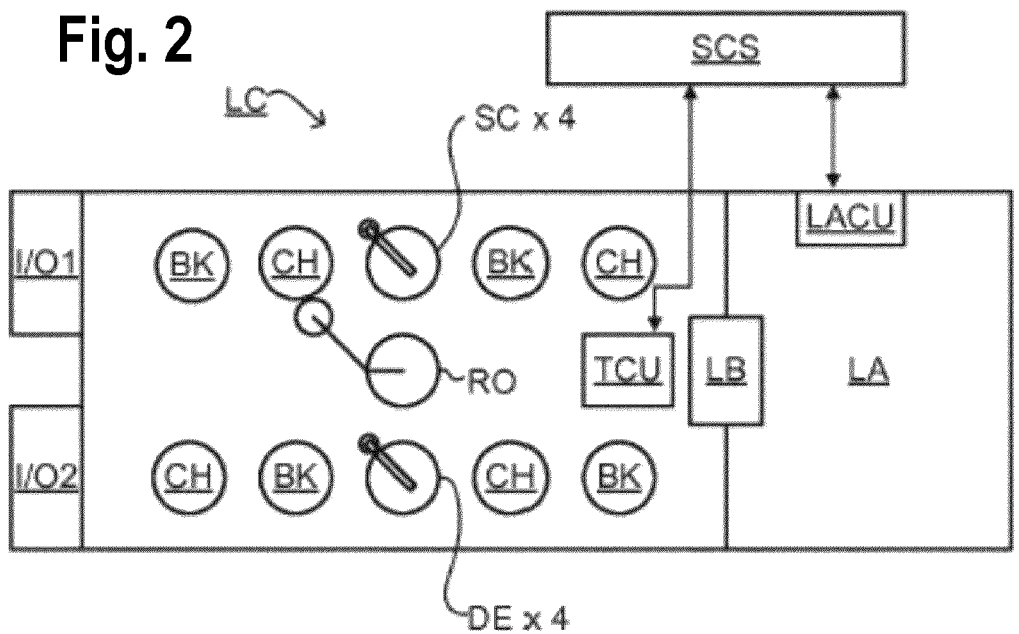
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, may be under the control of a track control unit TCU that in itself may be controlled by a supervisory control system SCS, which may also control the lithographic apparatus LA, e.g. via lithography control unit LACU.

In lithographic processes, it is desirable to make frequent measurements of the structures created, e.g., for process control and verification. Tools to make such measurements may be called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray, extreme ultraviolet, hard x-ray and visible to near-IR wavelength range.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the spectrum of diffracted radiation and/or the detection configuration, the asymmetry being related to the extent of the overlay. It is noted that diffracted radiation can include $0^{th}$ order diffraction as well as higher orders of diffraction. The two (maybe overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. The pitch and line-width of the structures in the gratings may strongly depend on the measurement optics (in particular the NA of the optics) to be able to capture diffraction orders coming from the metrology targets. As indicated earlier, the diffracted radiation may be used to determine shifts between two layers (also referred to as 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 3:
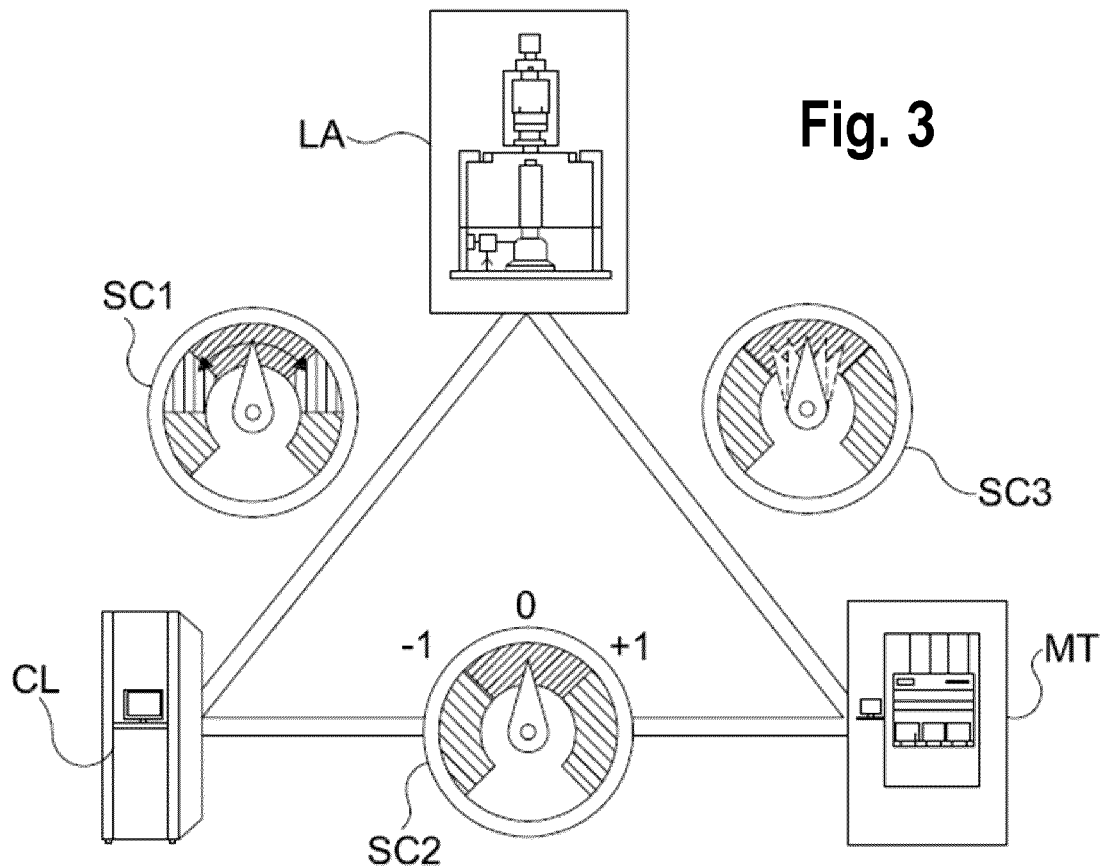
FIG. 3 depicts a schematic representation of holistic lithography, representing a cooperation between three key technologies to optimize semiconductor manufacturing.

The patterning process in a lithographic apparatus LA may be one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—maybe within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). The resolution enhancement techniques may be arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequent measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating may be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure in one image multiple targets from multiple gratings using light from hard x-ray, soft x-ray, extreme ultraviolet and visible to near-IR wave range.

Figure 4:
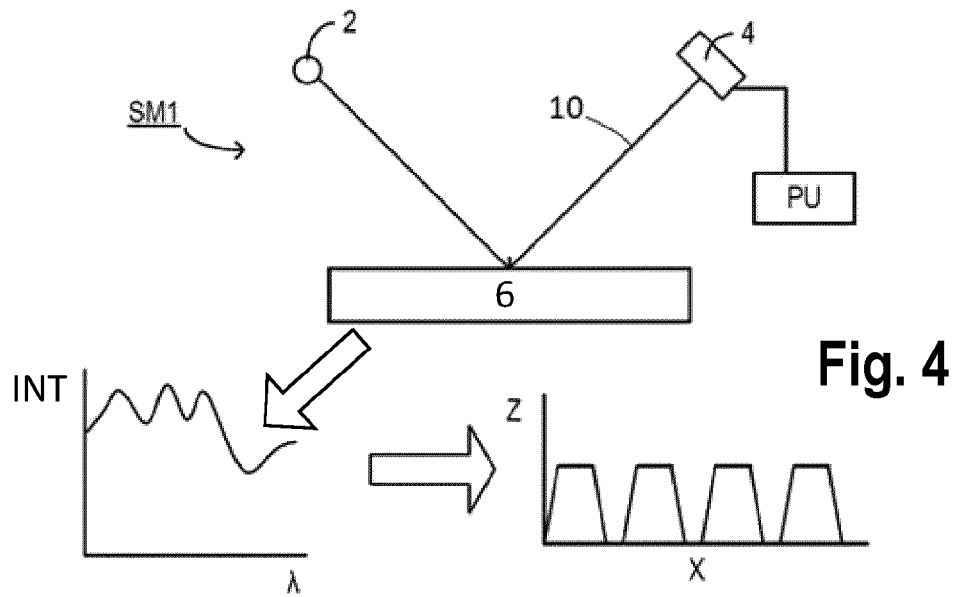
FIG. 4 schematically illustrates a scatterometry apparatus.

A metrology apparatus, such as a scatterometer, is depicted in FIG. 4. It comprises a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer. As an alternative to the method described above, asymmetry of multiple targets with different known overlay shifts (overlay biases) may be obtained, and from these asymmetries the overlay may be determined without the need for reconstruction.

There is a transmissive version of the example of a metrology apparatus, such as a scatterometer shown in FIG. 4. The transmitted radiation is passed to a spectrometer detector, which measures a spectrum as discussed for FIG. 4. Such a scatterometer may be configured as a normal-incidence scatterometer or an oblique-incidence scatterometer. Optionally, the transmissive version using hard X-ray radiation with wavelength<1 nm, optionally <0.1 nm, optionally <0.01 nm.

As an alternative to optical metrology methods, it has also been considered to use hard X-ray, soft X-rays or EUV radiation, for example radiation with at least one of the wavelength ranges: <0.01 nm, <0.1 nm, <1 nm, between 0.01 nm and 100 nm, between 0.01 nm and 50 nm, between 1 nm and 50 nm, between 1 nm and 20 nm, between 5 nm and 20 nm, and between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD) measurements using T-SAXS are discussed by Lemaillet et al in "Intercomparison between optical and X-ray scatterometry measurements of FinFET structures", Proc. of SPIE, 2013, 8681. It is noted that the use of laser produced plasma (LPP) x-ray source is described in U.S. Patent Publication No. 2019/003988A1, and in U.S. Patent Publication No. 2019/215940A1, which are incorporated herein by reference in the entirety. Reflectometry techniques using X-rays (GI-XRS) and extreme ultraviolet (EUV) radiation at grazing incidence may be used for measuring properties of films and stacks of layers on a substrate. Within the general field of reflectometry, goniometric and/or spectroscopic techniques may be applied. In goniometry, the variation of a reflected beam with different incidence angles may be measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The contents of the cited US patent application are incorporated herein by reference in their entirety.

Figure 5:
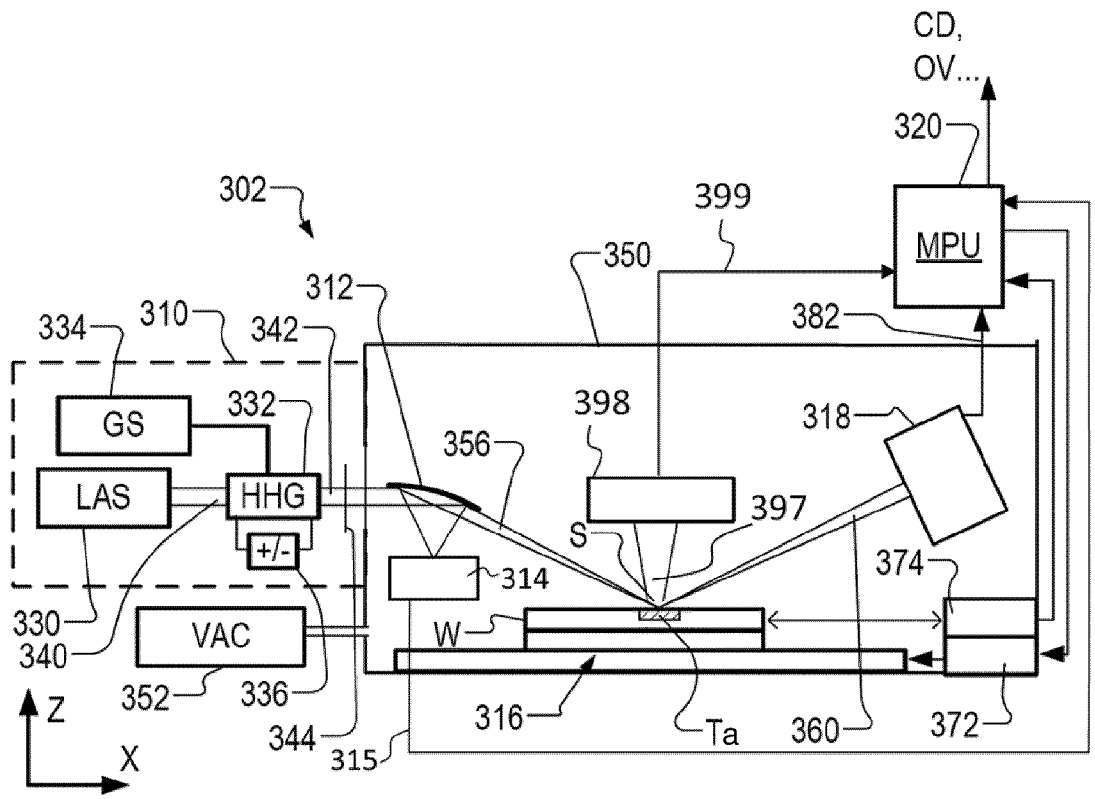
FIG. 5 depicts a schematic representation of a metrology apparatus.

FIG. 5 depicts a schematic representation of a metrology apparatus 302 in which radiation in the wavelength range from 0.1 nm to 100 nm may be used to measure parameters of structures on a substrate. The metrology apparatus 302 presented in FIG. 5 is suitable for the soft X-rays or EUV domain. In the case that hard X-rays are used, the metrology apparatus 302 need to be adapted to a transmission geometry e.g. Small-angle X-ray scattering (SAXS).

FIG. 5 illustrates a schematic physical arrangement of a metrology apparatus 302 comprising a spectroscopic scatterometer using e.g. EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source or so called illumination source 310, illumination system 312, substrate support 316, detection systems 318, 398 and metrology processing unit (MPU) 320.

An illumination source 310 in this example is for a generation of EUV or soft x-ray radiation, which may be based on high harmonic generation (HHG) techniques. Main components of the radiation source are a pump radiation source 330 operable to emit the pump radiation and a gas delivery system 332. Optionally the pump radiation source 330 is a laser, optionally the pump radiation source 330 is a pulsed high-power infrared or optical laser. The pump radiation source 330 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). Optionally, the laser pulses are delivered as a first pump radiation 340 to the gas delivery system 332, where in the gas a portion of the radiation is converted to higher frequencies than the first radiation into an emitted radiation 342. A gas supply 334 supplies a suitable gas to the gas delivery system 332, where it is optionally ionized by an electric source 336. The gas delivery system 332 may be a cut tube which will be discussed in the later text.

The emitted radiation may contain multiple wavelengths. If the emitted radiation were monochromatic, then measurement calculations (for example reconstruction) may be simplified, but it is easier to produce radiation with several wavelengths. An emission divergence angle of the emitted radiation may be wavelength dependent. A gas provided by the gas delivery system 332 defines a gas target, which may be a gas flow or a static volume. The gas may be for example a noble gas such as neon (Ne), helium (He) or argon (Ar). $N_2$, $O_2$, Ar, Kr, Xe gases may all be considered. These may be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific harmonic wavelengths from among those generated. Some or all of the beam path may be contained within a vacuum environment, bearing in mind that SXR/EUV radiation is absorbed when traveling in air. The various components of radiation source 310 and illumination optics 312 may be adjustable to implement different metrology 'recipes' within the same apparatus. For example different wavelengths and/or polarization may be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm may suffer from very low critical angle when reflecting off materials of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labelled T. The atmosphere within inspection chamber 350 is maintained near vacuum by vacuum pump 352, so that EUV radiation may pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 µm in diameter, when projected onto the structure of interest. Substrate support 316 comprises for example an X-Y translation stage and a rotation stage, by which any part of the substrate W may be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected (or diffracted $0^{th}$ order) radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target has a certain periodicity, the radiation of the focused beam 356 may be partially diffracted as well. The diffracted radiation 397 follows another path at well-defined angles with respect to the angle of incidence then the reflected radiation 360. In FIG. 5, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 5 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 may also communicate with a position controller 372 which operates the translation stage, rotation and/or tilting stages. Processor 320 receives highly accurate feedback on the position and orientation of the substrate, via sensors. Sensors 374 may include interferometers, for example, which may give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured may include overlay (OVL), critical dimension (CD), focus of the lithography apparatus while the lithography apparatus printed the target structure, coherent diffraction imaging (CDI), at-resolution overlay (ARO) metrology and edge placement error (EPE). The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 may be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV and/or Soft X-Ray (SXR) and/or Hard X-Ray (HXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) to obtain radiation at the desired wavelength(s). One of the challenges faced in the development of these sources is how to couple the emitted radiation out of the generating setup efficiently and separate the emitted radiation from the radiation used to drive the process.

Figure 6:
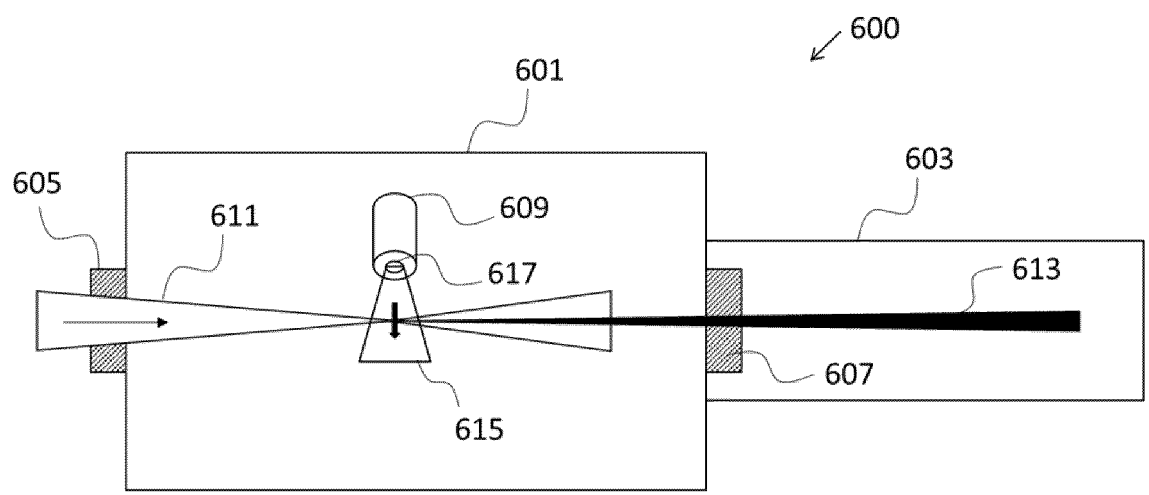
FIG. 6 shows a simplified schematic drawing of an illumination source.

FIG. 6 shows a simplified schematic drawing of an embodiment 600 of an illumination source 310, which may be the illumination source for high harmonic generation. One or more of the features of the illumination source in the metrology tool described with respect to FIG. 5 may also be present in the illumination source 600 as appropriate. The illumination source 600 comprises a chamber 601. The illumination source 600 is configured to receive a pump radiation 611 with a propagation direction which is indicated by an arrow. The pump radiation 611 shown here is an example of the pump radiation 340 from the pump radiation source 330, as shown in FIG. 5. The pump radiation 611 may be directed into the chamber 601 through the radiation input 605, which maybe a viewport which may be made of fused silica or a comparable material. The pump radiation 611 may have a Gaussian or hollow, for example annular, transversal cross-sectional profile and may be incident, optionally focused, on a gas flow 615, which has a flow direction indicated by a second arrow, within the chamber 601. The gas flow 615 comprises a small volume (for example several cubic mm) of a particular gas (e.g., a noble gas, optionally Helium, Argon, or Neon, nitrogen, oxygen or carbon dioxide) in which the gas pressure is above a certain value. The gas flow 615 may be a steady flow. Other media, such as metallic plasmas (e g aluminium plasma) may also be used.

The gas delivery system of the illumination source 600 is configured to provide the gas flow 615. The illumination source 600 is configured to provide the pump radiation 611 in the gas flow 615 to drive the generation of emitted radiation 613. The region where at least a majority of the emitted radiation 613 is generated is called an interaction region. The interaction region may vary from several tens of micrometers (for tightly focused pump radiation) to several mm or cm (for moderately focused pump radiation) or even up to a few meters (for extremely loosely focused pump radiation). Optionally, the gas flow 615 is provided by the gas delivery system into an evacuated or nearly evacuated space. The gas delivery system comprises a gas nozzle 609, as shown in FIG. 6, which comprises an opening 617 in an exit plane of the gas nozzle 609. The gas flow 615 is provided from the opening 617. In almost all the prior arts, the gas nozzle has a cut tube geometry shape which is a uniform cylinder interior geometry shape, and the shape of the opening in the exit plane is round. An elongated opening has also been used as described in the patent application CN101515105B.

The dimensions of the gas nozzle 609 may conceivably also be used in scaled-up or scaled-down versions ranging from micrometer-sized nozzles to meter-sized nozzles. This wide range of dimensioning comes from the fact that the setup should be scaled such that the intensity of the pump radiation at the gas flow ends up in the particular range which may be beneficial for the emitted radiation, which requires different dimensioning for different pump radiation energies, which may be a pulse laser and pulse energies can vary from tens of microjoules to joules.

Due to interaction of the pump radiation 611 with the gas atoms of the gas flow 615, the gas flow 615 will convert part of the pump radiation 611 into the emitted radiation 613, which may be an example of the emitted radiation 342 shown in FIG. 5. The central axes of the emitted radiation 613 may be collinear with the central axes of the incident pump radiation 611. The emitted radiation 613 may have a wavelength in X-ray or EUV range, wherein the wavelength is in a range from 0.01 nm to 100 nm, optionally from 0.1 nm to 100 nm, optionally from 1 nm to 100 nm, optionally from 1 nm to 50 nm, or optionally from 10 nm to 20 nm.

In operation the emitted radiation 613 beam may pass through a radiation output 607 and may be subsequently manipulated and directed by an illumination system 603, which may be an example of the illumination system 312 in FIG. 5, to a wafer to be inspected for metrology measurements. The emitted radiation 613 may be guided, optionally focused, to a target on the wafer.

Because air (and in fact any gas) heavily absorbs SXR or EUV radiation, the volume between the gas flow 615 and the wafer to be inspected may be evacuated or nearly evacuated. Since the central axes of the emitted radiation 613 may be collinear with the central axes of the incident pump radiation 611, the pump radiation 611 may need to be blocked to prevent it passing through the radiation output 607 and entering the illumination system 603. This may be done by incorporating a filtering device 344 shown in FIG. 5 into the radiation output 607, which is placed in the emitted beam path and that is opaque or nearly opaque to the driving radiation (e.g. opaque or nearly opaque to infrared or visible light) but at least partially transparent to the emitted radiation beam. The filter may be manufactured using zirconium. The filter may be a hollow, optionally an annular, block when the pump radiation 611 has a hollow, optionally an annular, transversal cross-sectional profile.

Note that the illumination source 600 shown in FIG. 6 is just an example, while in practice any other illumination sources with other configurations could be used as the illumination source 310 in FIG. 5. For example, liquid-metal-jet X-ray source, inverse Compton scattering source, or HHG source with a capillary instead of the gas nozzle shown in FIG. 6. In case of the emitted radiation 342 has a wavelength in hard X-ray region, the metrology apparatus in FIG. 5 may be adapted to a transmission geometry.

Described herein are methods, apparatuses, and assemblies to obtain emitted radiation optionally at a high harmonic frequency of pump radiation. The radiation generated through the process, optionally the HHG which uses non-linear effects to generate radiation at a harmonic frequency of provided pump radiation, may be provided as radiation in metrology tools MT for inspection and/or measurement of substrates. The substrates may be lithographically patterned substrates. The radiation obtained through the process may also be provided in a lithographic apparatus LA, and/or a lithographic cell LC. The pump radiation may be pulsed radiation, which may provide high peak intensities for short bursts of time.

The pump radiation 611 may comprise radiation with one or more wavelengths higher than the one or more wavelengths of the emitted radiation. The pump radiation may comprise infrared radiation. The pump radiation may comprise radiation with wavelength(s) in the range of 800 nm to 1500 nm. The pump radiation may comprise radiation with wavelength(s) in the range of 900 nm to 1300 nm. The pump radiation may comprise radiation with wavelength(s) in the range of 100 nm to 1300 nm. The pump radiation may be pulsed radiation. Pulsed pump radiation may comprise pulses with a duration in the femtosecond range.

For some embodiments, the emitted radiation, optionally the high harmonic radiation, may comprise one or more harmonics of the pump radiation wavelength(s). The emitted radiation may comprise wavelengths in the extreme ultraviolet (EUV), soft X-Ray (SXR), and/or hard X-Ray part of the electromagnetic spectrum. The emitted radiation 613 may comprise wavelengths in the range of 0.01 nm to 100 nm. The emitted radiation 613 may comprise wavelengths in the range of 0.1 nm to 100 nm. The emitted radiation 613 may comprise wavelengths in the range of 0.1 nm to 50 nm. The emitted radiation 613 may comprise wavelengths in the range of 1 nm to 50 nm. The emitted radiation 613 may comprise wavelengths in the range of 10 nm to 20 nm.

Radiation, such as high harmonic radiation described above, may be provided as source radiation in a metrology tool MT. The metrology tool MT may use the source radiation to perform measurements on a substrate exposed by a lithographic apparatus. The measurements may be for determining one or more parameters of a structure on the substrate. Using radiation at shorter wavelengths, for example at EUV and/or SXR and/or HXR wavelengths as comprised in the wavelength ranges described above, may allow for smaller features of a structure to be resolved by the metrology tool, compared to using longer wavelengths (e.g. visible radiation, infrared radiation). Radiation with shorter wavelengths, such as EUV and/or SXR and/or HXR radiation, may also penetrate deeper into a material such as a patterned substrate, meaning that metrology of deeper layers on the substrate is possible. These deeper layers may not be accessible by radiation with longer wavelengths.

In a metrology tool MT, source radiation may be emitted from a radiation source and directed onto a target structure (or other structure) on a substrate. The source radiation may comprise EUV and/or SXR and/or HXR radiation. The target structure may reflect and/or diffract the source radiation incident on the target structure. The metrology tool MT may comprise one or more sensors for detecting diffracted radiation. For example, a metrology tool MT may comprise detectors for detecting the positive (+1st) and negative (−1st) first diffraction orders, or the positive (+3rd) and negative (−3rd) third diffraction orders. The metrology tool MT may also measure the specular reflected radiation (0th order diffracted radiation). Further sensors for metrology may be present in the metrology tool MT, for example to measure further diffraction orders (e.g. higher diffraction orders).

Generally, methods and apparatus disclosed herein allow compensation for target drift and/or system drift when measuring a parameter of a structure fabricated in or on a substrate. As stated above, the term "target drift" encompasses error in measurement of the parameter due to material deposition and/or changes in the resist, in particular resist shrinkage. The term "system drift" encompasses errors caused by elements of the system, such as thermal errors.

Figure 7:
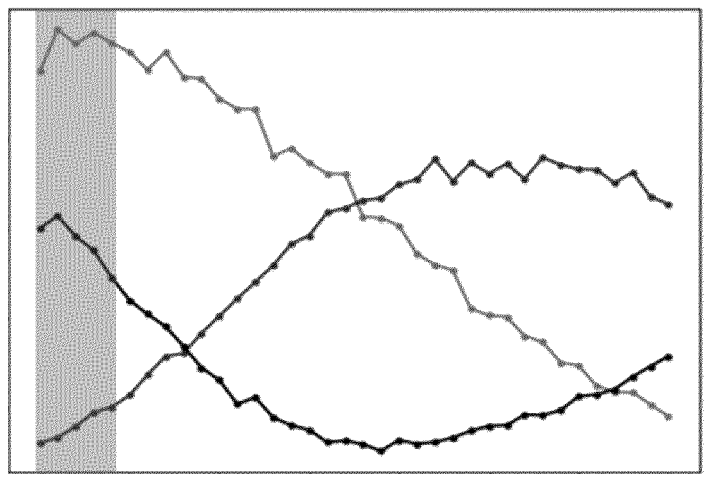
FIG. 7 shows a plot of reflectance at a plurality of wavelengths against illumination time of a structure or target.

On ADI overlay targets measured with e.g. SXR it was recently found that after illumination of a target (or other structure e.g. product structures) with electromagnetic radiation, an intensity of first-order diffracted radiation from the target is time dependent, and specifically illumination time dependent. That is, the intensity of diffracted radiation is a function of the amount of time that the target has spent under illumination, as shown in FIG. 7, which presents plots of diffracted radiation intensity, as Y axis, against illumination time, as X axis, for three separate wavelengths of radiation. This is thought to originate from the abovementioned target drift contributions, e.g. from material deposition e.g. carbon deposition, and/or resist shrinkage. This time dependent intensity introduces errors into correction determined based on measurements of a target at different orientations, such as 180 degree rotation, as the diffracted radiation intensity during the second (e.g. rotated target orientation) measurement is no longer the same as during the first (nominal) measurement. This may result in incorrect asymmetry values, that is, asymmetry values that do not represent the overlay of the target.

Figure 8:
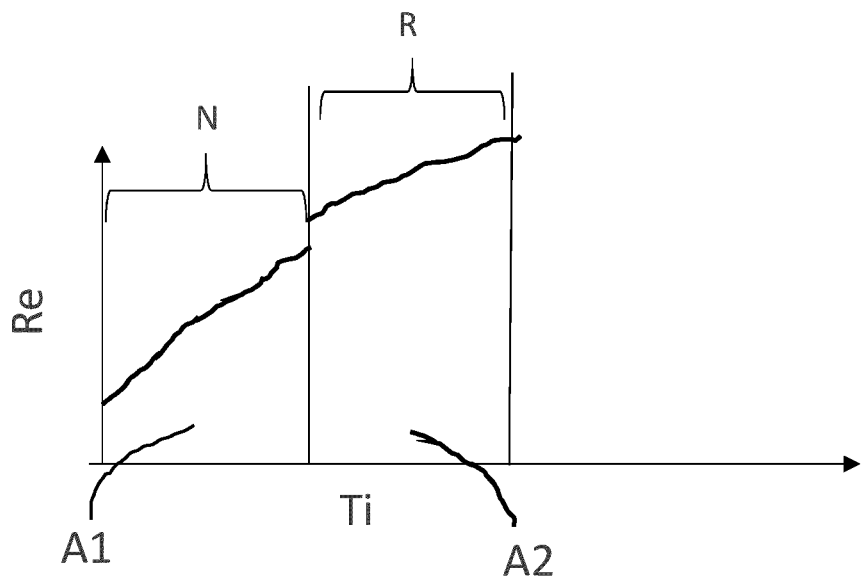
FIGS. 8-10 show plots of reflectance against time for different illumination and measurement schemes with structures at first and second orientations.
Figure 9:
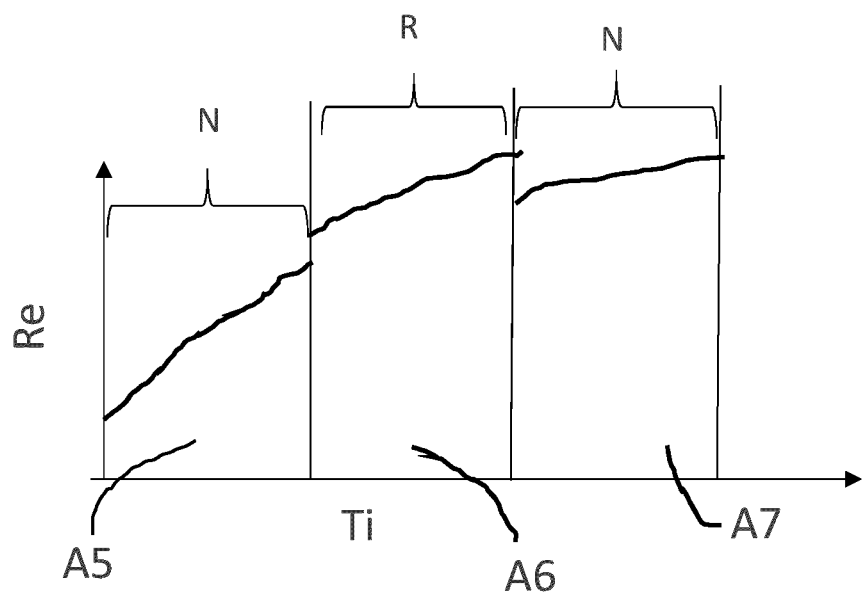

An example of this is shown in FIG. 8, which shows a plot of reflectance (Re) against time (Ti) with the target in a first, nominal orientation (N) and a second, rotated orientation (R). In FIGS. 8 and 9, for the sake of illustration, the proportionality constant in the signal is taken to be unity. The intensity of the reflectance from the target for the N and R orientation vary over time as indicated by the curves labelled N and R in FIG. 8. The target is illuminated with electromagnetic radiation in the first orientation and reflectance from the target is sensed and integrated over time, resulting in the area under the curve A1. The target is then illuminated with electromagnetic radiation in the second orientation and reflectance from the target is sensed and integrated over time, resulting in the area under the curve A2. The N signal is offset from the R signal and so the integrals A1 and A2 would lead to incorrect conclusions about the target asymmetry and subsequently about the parameter to be measured, e.g. overlay and CD.

In exemplary arrangements, at least part of a structure fabricated in or on a substrate is illuminated by electromagnetic radiation in a first orientation (e.g. nominal orientation) and in a second orientation (e.g. a rotated orientation). Reflectance from the structure is measured in the nominal and rotated orientations, wherein for at least one of the target orientations multiple illuminations and measurements of reflectance are performed. The measurements of reflectance in the first and/or second orientations may then be combined to obtain a corrected asymmetry. In some exemplary methods and apparatus, the measurements of reflectance are combined in such a way that the measurements at the first and/or second orientation(s) at which multiple measurements have been performed provide an estimate of the intensity of reflectance at their target orientation during an interval of the total measurement time.

The error due to target drift is reduced in the asymmetry determined as set out above with respect to the prior art (nominal-rotated).

In one example, which is shown in FIG. 9, a measurement scheme comprising nominal-rotated-nominal (N-R-N) measurement is executed. That is, the first orientation is the nominal orientation and at least part of the structure is illuminated a plurality of times in the first orientation, optionally two times as shown in FIG. 9. Signals are measured at the plurality of times and reflectances may be estimated from the measurements. A measurement of the parameter is determined based on the reflectances at the plurality of times. In other arrangements, the signals may be used to determine asymmetry and the parameter may be determined based on the asymmetry. The intensity of the reflectances may be defined as the area under the curve divided by the exposure time (A5, A6 and A7). The average of the reflectances at the two nominal intensity measurements is taken as an estimate of the reflectance at the time of the measurement at the rotated orientation. That is, the drift, which is shown by the curve of the N and R lines in FIG. 9, is considered to be predominantly linear. The impact of target drift on asymmetry is reduced by taking the average of the two nominal reflectance measurements.

The example shown in FIG. 9 provides a full correction in case of a predominantly linear illumination time dependence of reflectance. Further illumination and measurement schemes, such as illuminating and measuring reflectance at nominal-nominal-rotated-nominal-nominal or others mentioned below, allow a correction beyond a predominantly linear relationship, e.g. a predominantly polynomial of $2^{nd}$ order in time. It is also noted that illumination and measurement schemes may illuminate and measure reflectance at the first and second orientations in any order. The order may be determined to maximise throughput.

The plurality of reflectance measurements at the first orientation may each be shorter in duration than the reflectance measurement at the second orientation. For example, the total duration of the measurements at the first orientation may be the same as that of the second orientation. In the example of FIG. 9, the first nominal reflectance measurement (relating to A5) may take a first period of time, the rotated reflectance measurement (relating to A6) may take a second period of time, which may be substantially double the first period of time, and the second nominal reflectance measurement (relating to A7) may take a third period of time, which may be substantially the same as the first period of time. In this way, the ratio of total measurement time per orientation may be the same as in known methods. For the signal-to-noise ratio of the signal, it may be advantageous to have approximately equal total reflectance measurement time spent in the first and second orientations.

There may be multiple measurements at the first (e.g. nominal) and second (e.g. rotated) orientations of the target (or other structure). For example, an illumination and measurement scheme may comprise illumination and measurement of reflectance at orientations nominal-rotated-nominal-rotated-nominal (nom-rot-nom-rot-nom). With schemes having a plurality of illuminations and measurements of reflectance at the first and second orientations, information on the time dependence of the reflectance at both nominal and rotated orientations can be obtained, with which an estimate of the nominal and rotated orientation intensity can be obtained.

In the above example (nom-rot-nom-rot-nom) an estimate may for instance be obtained of the reflectance at nominal and rotated orientations during the first half of the second nominal measurement. The interval for which the reflectance is estimated is therefore not necessarily equal to an integration time of the original measurements (here the 5 subsequent measurements). Alternatively, the estimate may be for the reflectance per time period during the first rotated, second nominal and second rotated measurement.

Figure 10:
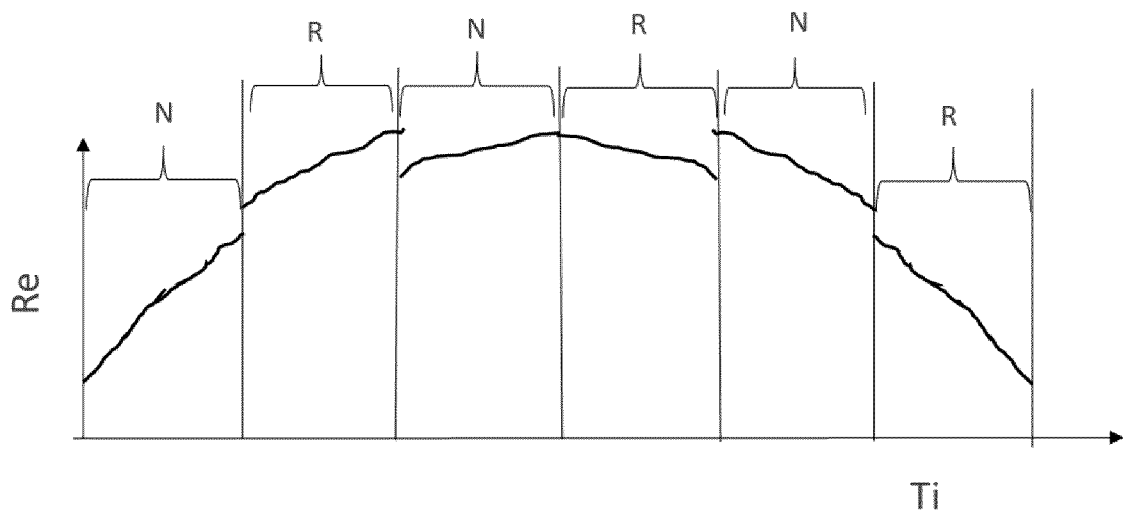

If it is expected that the reflectance does not vary in a linear way with the cumulative illumination time, exemplary arrangements may include an illumination and measurement scheme that works correctly for signals that vary according to a model including predominantly polynomial terms, such as a predominantly second-order polynomial. An example is shown in FIG. 10, which shows a drift error that is not linear with illumination time, but includes predominantly polynomial terms. In the example of FIG. 10, an illumination and measurement scheme comprises a sequence of illuminations and measurements with the target at first (e.g. nominal) and second (e.g. rotated) orientations as NRNRNR (i.e. a total of six exposures (illumination and measurement) with equal exposure times, measured without gaps in between). In such arrangements, a weighted average of the 'N' and 'R' measured reflectances may be used to model the drift error with illumination time. For example, a weighted average of the 'N' measured reflectances with weights [0.813, 0.625, 1.563], respectively, and a weighted average of the 'R' measured reflectances with weights [1.563, 0.625, 0.8125], respectively. If there are gaps between measurements, for example to allow for rotation of the substrate, the weights can be adjusted. For example, if the gap time is 25% of the illumination time, the weights may be [0.75, 0.75, 1.5] for the 'N' exposures and the reverse order for the 'R' exposures.

In some examples disclosed herein, weighting factors for the 'N' and 'R' exposures are chosen such that an estimate is obtained for the average 'N' reflectance over the entire measurement sequence and the average 'R' reflectance over the entire measurement sequence. In order to do this, assuming that the time dependence is described by a predominantly 2nd-order (quadratic) polynomial, such examples may undertake at least three 'N' exposures and at least three 'R' exposures. In other examples, a measurement sequence has only one 'R' exposure and multiple 'N' exposures (or the other way around). The duration of the 'R' exposure (or 'N' in the case where there are more 'R' exposures than 'N' exposures) may be longer than the individual 'N' exposures such that the contribution from shot noise is mitigated. The weighting factors for the 'N' exposures may be chosen such that an estimate of the 'N' reflectance during the 'R' exposure is obtained. For example, suppose that a measurement sequence is N-R-N-N with relative exposure times 1-2-1-1. If the exposures are back-to-back without gaps, the weights of the 'N' reflectances can be taken as [0.333, 1.167, −0.500]. If the reflectance varies over time as a predominantly 2nd-order polynomial, the sum of the products of reflectances and weights will be equal to the average 'N' reflectance during the 'R' exposure. For example, if the N-reflectances are 0.5, 0.48, and 0.42, then the estimated N-reflectance during the time window of the 'R' exposure is 0.333*0.5+1.167*0.48−0.500*0.42=0.517. This approach can be generalized for other sequences, such as NNRN, NNRNN, and with different exposure times and with different gaps between the exposures. It could also be applied to a sequence such as NRNRN with two 'R' exposures; weighting factors are chosen such that we can take the average 'R' reflectance from the two 'R' exposures and estimate the average 'N' reflectance during the 'R' exposures.

In addition to correcting for drift error in the ways mentioned herein, exemplary methods and apparatus may determine a drift error rate based on the plurality of measured reflectances at the same orientation. In exemplary arrangements, the drift error rate can be determined during recipe set-up of the metrology tool, and then applied to correct measurements performed during high-volume tool operation. An advantage of this approach is that during high-volume tool operation only a single measurement per target orientation is needed, which increases throughput of the tool.

There may be multiple nominal-rotated orientations, e.g. measurements at 0 degrees and 180 degrees in-plane rotation, and measurements at 90 degrees and 270 degrees in-plane rotation. A model of the time dependent reflectance change, e.g. a sinusoidal change of intensity over time, may be applied to the multiple measurements to provide the estimate. Alternatively, numerical integration techniques (e.g. (weighted) averages may be used to provide the estimate.

In some exemplary methods and apparatus, reflectance from a plurality of structures, such as overlay targets may be measured in a first (e.g. nominal) orientation. The reflectance from (some of) the same overlay targets may be measured in a second, rotated orientation. Then the reflectance from (some of) the same overlay targets is measured again in at least one of the nominal or rotated orientations. Reflectance from at least some of the multiple targets is therefore measured at least three times, including measurements performed in both nominal and rotated orientations. The measured reflectances are then combined to obtain a corrected asymmetry. They may be combined in such a way that the measurements at the target orientation(s) at which multiple measurements were performed provide an estimate of the intensity during an interval of the total measurement time.

In such arrangements, a plurality of overlay targets are illuminated with radiation and the resulting reflectance measured. This may be done sequentially with each of the plurality of targets (e.g. one target is measured in each measurement) in the first orientation. The substrate (and therefore the target) may then be rotated relative to the illumination source. It is noted here that rotation of the target to a different orientation relative to the illumination source may comprise physical rotation of the substrate, physical rotation of the illumination source and/or changes in the nature (e.g. the polarization) of the radiation emitted by the illumination source.

In addition to target drift, tool drift may also be extracted when illuminating and measuring a plurality of targets in one or more of the first and second orientations because there is a longer time interval between measurements of the same target in different orientations. In some exemplary arrangements, the illumination and measurement schemes may allow for distinguishing target drift and tool drift. Measuring multiple overlay targets sequentially in the same orientation, compared to rotating the substrate (wafer) after each target measurement, reduces the total number of substrate rotations, allowing greater throughput and reducing measurement errors (e.g. alignment errors).

Figure 11:
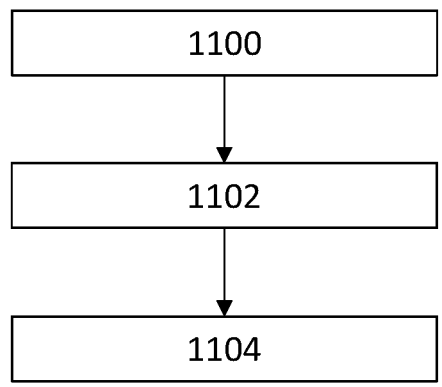
FIG. 11 comprises a flow diagram of steps in a method of generating an emitted radiation.

FIG. 11 shows a flow diagram for an exemplary method of determining a parameter of a structure fabricated in or on a substrate. The determined parameter is compensated for drift error. The method comprises illuminating 1100 at least part of the structure a plurality of times with electromagnetic radiation, whilst the structure is in a first orientation.

Illumination of the at least part of the structure may be undertaken by an exemplary illumination source, such as those disclosed herein. In addition, illumination may be done using radiation having one or more wavelengths, or in a range of wavelengths. For example, the radiation may comprise radiation having a wavelength in a range from 0.01 nm to 100 nm. Other more specific ranges may be used, such as those disclosed herein.

The structure is at a first orientation. This may relate to an orientation with respect to the illumination source. The orientation may be a physical orientation or may be generated using a parameter, such as polarization, of the radiation.

The plurality of times that the structure is illuminated may be sequential. Alternatively, other illuminations may occur between one or more pairs of the plurality of illuminations in the first orientation. This will be evident from the illumination and measurement schemes disclosed herein, which include schemes comprising a plurality of alternating orientations.

The method further comprises sensing 1102 a plurality of reflectances from the at least part of the structure. The reflectance is a result of the illumination of the structure using the radiation discussed above. The reflectances are sensed (measured) at the plurality of times, i.e. during illumination of the structure. The reflectances are indicative of the parameter at the plurality of times, which parameter may, for example, be overlay or CD. It is noted that in exemplary arrangements, the reflectances may comprise an integration of intensity over a time period. The time period may be part or all of the time during which the structure is illuminated.

Based on the plurality of reflectances, an estimation of the parameter is determined 1104 at a further time that is different to the plurality of times. The further time may be between two of the plurality of times, such as in an illumination and measurement scheme comprising nominal, rotated, nominal orientations of the structure. Alternatively, the further time may be a time before or a time after the plurality of times. In some exemplary arrangements, an estimation of the drift error at the further time may be determined based on the plurality of sensed reflectances. This may be done in addition to or as an alternative to the determination of the parameter at the further time. The determined drift error may be target drift error or a combination of target drift and system drift.

In some exemplary arrangements, determining 1104 the estimation of the parameter at the further time may comprise illuminating at least part of the structure at the further time when the structure is in a second orientation, and sensing the resulting reflectance. There may be a plurality of illuminations of at least part of the structure and there may be a plurality of sensing the resulting reflectance at a plurality of further times. The estimation of the parameter at the one or more further times may be based on the sensed reflectances at the one or more further times with the structure in the second orientation.

As discussed above, the difference between having the structure (e.g. target) in the first and second orientations may be embodied in the use of separate illumination sources, the rotation of an illumination source or the use of radiation having different parameters, such as p-polarized radiation and s-polarized radiation, all of which may achieve relative rotation of the structure compared to the illumination source. However, in typical arrangements, the substrate may be rotated on the substrate support WT. Rotation may be about a z-axis that is normal to a plane of the substrate. Rotation may be 180 degrees, although in some arrangements rotation may be 90 degrees or any other angle suitable for measurement of the parameter.

In exemplary arrangements, the determination 1104 of the parameter is based on the total radiation dose of the at least part of the structure in the first and second orientations. The total radiation dose may be proportional to the illumination time of the structure in the first and/or second orientations. The total radiation dose for a particular orientation may comprise a summation of the illumination time of the structure in that orientation, either at the plurality of times or at the plurality of further times. Examples of such arrangements are discussed above, in which the total radiation dose in the first and second orientations is substantially equal. This may be used in combination with an assumption that the drift error changes predominantly linearly with illumination time. Further examples include the use of weighted sums of the reflectances, as discussed above. This may be used in combination with an assumption that the drift error changes with illumination time based a relationship including one or more polynomial terms. The weights applied in determining the weighted average(s) may be based on a time between illuminations of the at least part of the structure. For example, if the substrate is rotated between illuminations then the weights may be determined accordingly, as discussed in the example above.

In exemplary arrangements in which the relationship of the drift error to illumination time can be assumed to be predominantly linear, a drift error rate may be determined based on that predominantly linear relationship. This may then be used on illumination and measurement of subsequent structures, which may be on the same substrate and/or on further substrates. Use of the drift error rate allows estimation of the parameter without having to repeat the plurality of illuminations and measurements at the plurality of times in the first orientation.

The illumination 1100 at the plurality of times may comprise illumination of a plurality of structures (e.g. targets) on the substrate with the substrate, and therefore the structures, in a first orientation.

An example of an illumination and measurement scheme may be N1a, N1b, R1a, R1b, N2a, N2b, where N denotes the first (nominal) orientation and R denotes the second (rotated) orientation, the numbers 1 and 2 denote the first and second illuminations and subsequent measurements of a structure, and a and b denote two different structures. This may permit determination of an estimation of target drift and/or an estimation of system drift separately based on the reflectances.

In the above scheme the average of the sensed reflectances of N1a and N2a may, for example, provide an estimate of the reflectance at the nominal orientation at the time of R1a. As the time interval N1a-R1a is substantially the same as the time interval N2a-R1a (assuming the same illumination and measurement time for each), this average provides a (partial) compensation for both target drift and tool drift. In this simple case it may therefore not be necessary to distinguish tool and target drift.

If the time intervals mentioned above are different, then a weighted average may be used. For example with a time interval $t_{1a}$ between N1a-R1a and $t_{2a}$ between R1a-N2a, weighting factors $t_{2a}/(t_{1a}+t_{2a})$ and $t_{1a}/(t_{1a}+t_{2a})$ may be applied to measurements N1a and N2a, respectively.

In some arrangements, only the first structure 'a' may be measured multiple e.g. three times and the drift error of structure 'b' may be calculated based on the multiple measurements of structure 'a'. The illumination and measurement scheme in this example may be N1a, N1b, R1a, N2a. As now the time interval R1a-N1a is longer than N2a-R1a (assuming the same illumination and measurement time for each) the estimate of the reflectance at the nominal orientation at the time of the measurement of the reflectance at the rotated orientation may distinguish target drift from system (or tool) drift. This may be done as follows: from the difference in intensity between N1b and N1a the tool drift rate is estimated (target drift is, assuming a constant radiation dose, the same for targets 'a' and 'b'; for simplicity is it assumed that noise is negligible). From N2a-N1a is then subtracted the system drift rate multiplied by the time interval between these measurements so as to obtain the target drift rate. Tool and target drift rates can then be used to calculate the reflectance at the nominal orientation at the time of the rotated orientation illumination and measurement, as mentioned above. Note that here it is assumed that the correction of structure 'a', that is extracted using the system and target drift rate estimates, can be applied to structure 'b'.

System drift and target drift rates may be determined as described above during recipe set-up of the tool (calibration). During operation of a tool for high-volume manufacturing, a single illumination and measurement of a structure then suffices, which increases throughput. It may be beneficial to re-evaluate system and target drift rates as described above periodically during high-volume tool operation. Even if correction needs to be performed for each structure (thus requiring two measurements (N and R) per structure), the target and drift rates extracted according to the above scheme can be used to allow such correction without a $3^{rd}$ measurement for each target.

Other features discussed above also apply to this scheme, e.g. the use of multiple structure orientations and multiple repetitions of illumination and measurement to compensate for higher order effects in drift.

Methods and apparatus disclosed herein may be applicable for overlay and/or CD, but also generally for estimation—in the presence of target drift—of a single metrology parameter that may be derived from a structure or target based on multiple illuminations and measurements of that target under different conditions. The multiple illuminations and measurements under different conditions are therefore combined to obtain the metrology parameter. The metrology parameter may still use reflectance and measurements may still be in different orientations (e.g. 0 degrees in-plane rotation and 90 degrees in-plane rotation), but in some arrangement may be combined to obtain a combined intensity detector image. A reason to do this may be that the detector is more elongated in one direction, so that for a 2D-diffraction target more diffraction orders are captured in one direction (e.g. x-direction) compared to the other direction (e.g. y-direction). A rotation by 90 degrees allows to capture of more orders in the other direction. In the case of measurements at 0 degrees and 90 degrees, signals are not subtracted in order to get an asymmetry, but are fed as a pair into an analysis algorithm.

In some arrangements, the measurements may be undertaken following illumination using s-polarized radiation for the first measurement and p-polarized radiation for the second measurement. The two measurements are fed into an analysis algorithm as a pair.

In further arrangements, the metrology parameter may be determined based on reflectance and the measurements may be undertaken following illumination using a radiation comprising a wavelength in a first spectrum for the first measurement and illumination using a radiation comprising a wavelength in a second spectrum for the second measurement.

Methods and apparatus disclosed herein differ from a CD-SEM situation in a number of ways. Methods and apparatus may differ with respect to the purpose and/or problem under consideration in that methods and apparatus disclosed herein may aim to enable correction for overlay extraction in the presence of sample drift. Such correction typically uses two measurements of the same target(s), which cannot be taken simultaneous and thus may include target drift. The purpose of CD-SEM is to retrieve the overlay of the unexposed state. Methods and apparatus disclosed herein may also differ from CD-SEM in how the method that is applied. In CD-SEM, shrinkage models extrapolation may be performed in combination with a model of resist shrinkage as a function of time and/or dose. Methods and apparatus disclosed herein do not involve extrapolation, but may use numerical integration-based techniques to computationally obtain measurements in nominal and rotated sample orientation at the same time.

Another application of the embodiments mentioned above may be the following: there may be situations in which the plus and minus orders of the radiation, e.g. SXR diffraction pattern cannot be detected at once as they do not fit on the detector(s) and thus at least two acquisitions are needed, wherein the detector(s) is translated in between these acquisitions. To account for target drift during these multiple optionally two acquisitions, the above-mentioned embodiments may be applied. One example is that after the second acquisition, the detector(s) go back to the detector position of the first acquisition and a third image is acquired. Averaging the first and third images at the first position may (partially) correct for target drift. Note that in this embodiment the detector changes orientation, while in the above-mentioned embodiments the sample changes orientation. An alternative of changing the detector position could be changing the target orientation. Another alternative could be changing the pointing of the beam incident on the sample slightly.

The illumination source may be provided in for example a metrology apparatus MT, optionally a metrology apparatus in a lithographic apparatus, an inspection apparatus, a lithographic apparatus LA, and/or a lithographic cell LC.

The properties of the emitted radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

Further embodiments are disclosed in the subsequent numbered clauses (clause set A):

1. A method of determining a parameter of a structure fabricated in or on a substrate and compensated for a drift error, the method comprising:
    illuminating, at a plurality of times, at least part of the structure with electromagnetic radiation, the at least part of the structure being at a first orientation;
    sensing, at the plurality of times, a plurality of average reflectances of the at least part of the structure, wherein the average reflectances are indicative of the parameter at the plurality of times;
    illuminating, at one or more further times, the at least part of the structure with electromagnetic radiation, the at least part of the structure being at a second orientation; and
    sensing, at the one or more further times, one or more further average reflectances of the at least part of the structure, wherein the further average reflectances are indicative of the parameter at the one or more further times; and
    determining, based on the plurality of average reflectances and the one or more further average reflectances, an estimation of the parameter at the one or more further times.

2. The method according to clause 1, further comprising estimating the drift error based on the plurality of average reflectances.

3. The method according to any preceding clause, wherein, in the second orientation, the at least part of the structure is rotated about a z-axis that is perpendicular to a plane of the substrate, the rotation being relative to a source of the electromagnetic radiation, and optionally wherein the rotation is one of 180 degrees and 90 degrees.

4. The method according to any preceding clause, wherein the one or more further times is a plurality of further times.

5. The method according to any preceding clause, wherein determining the estimation of the parameter is further based on a total radiation dose associated with the illumination of the at least part of the structure at the first orientation, and a total radiation dose associated with the illumination of the at least part of the structure at the second orientation.

6. The method according to clause 5, wherein the total radiation dose associated with the illumination of the at least part of the structure at the first orientation is substantially equal to the total radiation dose associated with the illumination of the at least part of the structure at the second orientation.

7. The method according to any preceding clause, where in the plurality of average reflectances and/or the further average reflectances comprise an integration of a radiation intensity over at least part of an illumination time.

8. The method according to any preceding clause, wherein determination of the estimation of the parameter is further based on a predominantly linear relationship between the drift error and illumination time of the at least part of the structure.

9. The method according to clause 8, further comprising determining a rate of change of the drift error for determining an estimation of the parameter for one or more structures fabricated in or on one or more further substrates.

10. The method according to any of clauses 1 to 7, wherein determination of the estimation of the parameter is further based on a relationship between the drift error and illumination time of the at least part of the structure that comprises one or more predominantly polynomial functions.

11. The method according to any clauses 1 to 7 and 10, wherein determining the estimation of the parameter comprises determining a weighted average of the plurality of average reflectances.

12. The method according to clause 11, wherein determining the estimation of the parameter comprises determining a weighted average of the plurality of further average reflectances.

13. The method according to clause 11 or 12, wherein weights applied when determining the weighted average are determined based on a time between illuminations of the at least part of the structure.

14. The method according to any preceding clause, wherein illumination at the plurality of times comprises:
    illumination, at a first time, of at least part of a first structure;
    illumination, at a second time, of at least part of a second structure; and
    illumination, at a third time, of at least part of the first structure, wherein the plurality of average reflectances are indicative of the parameter at the first, second and third times.

15. The method according to any preceding clause, wherein determining an estimation of the parameter comprises determining an estimation of target drift and/or an estimation of system drift based on the plurality of average reflectances.

16. The method according to clause 15, wherein determining an estimation of the system drift is based on a diffracted radiation intensity corresponding to illumination of the first structure at the first time and a diffracted radiation intensity corresponding to illumination of the second structure at the second time.

17. The method according to clause 15 or 16, wherein determining an estimation of the target drift is based on a diffracted radiation intensity corresponding to illumination of the first structure at the first time and a diffracted radiation intensity corresponding to illumination of the first structure at the third time.

18. The method according to any preceding wherein the electromagnetic radiation for illumination of the at least part of the structure in the first orientation is one of p-polarized and s-polarized electromagnetic radiation.

19. The method according to clause 18, wherein the electromagnetic radiation for illumination of the at least part of the structure in the second orientation is the other of p-polarized and s-polarized electromagnetic radiation.

20. The method according to any preceding wherein the electromagnetic radiation for illumination of the at least part of the structure in the first orientation comprises electromagnetic radiation in a first spectrum, and wherein the electromagnetic radiation for illumination of the at least part of the structure in the second orientation comprises electromagnetic radiation in a second spectrum.

21. The method according to any preceding clause, wherein the structure comprises a metrology target.

22. The method according to any preceding clause, wherein the parameter comprises one of overlay and critical dimension.

23. The method according to any preceding clause, wherein the electromagnetic radiation comprises electromagnetic radiation having a wavelength in a range from 0.01 nm to 100 nm.

24. The method according to any preceding clause, wherein the drift error is caused by material deposition or target shrinkage.

25. A computer program product comprising instructions which, when executed on at least one processor, cause the at least one processor to control an apparatus to carry out a method according to any preceding clause.

26. An apparatus for determining a parameter of a structure fabricated in or on a substrate and compensated for a drift error, the apparatus comprising a computer processor configured to control the apparatus to undertake the method of:
   illuminating, at a plurality of times, at least part of the structure with electromagnetic radiation, the at least part of the structure being at a first orientation;
   sensing, at the plurality of times, a plurality of average reflectances of the at least part of the structure, wherein the average reflectances are indicative of the parameter at the plurality of times;
   illuminating, at one or more further times, the at least part of the structure with electromagnetic radiation, the at least part of the structure being at a second orientation; and
   sensing, at the one or more further times, one or more further average reflectances of the at least part of the structure, wherein the further average reflectances are indicative of the parameter at the one or more further times; and
   determining, based on the plurality of average reflectances and the one or more further average reflectances, an estimation of the parameter at the one or more further times.

27. A metrology tool comprising an apparatus according to clause 26.

28. A lithographic system comprising an apparatus according to clause 26.

29. A lithographic cell comprising an apparatus according to clause 26.

Further embodiments are also disclosed in the subsequent numbered clauses (clause set B):

1. A method of determining a parameter of a structure fabricated in or on a substrate and compensated for a drift error, the method comprising:
   illuminating, at a plurality of times, at least part of the structure with electromagnetic radiation, the at least part of the structure being at a first orientation;
   sensing, at the plurality of times, a plurality of average reflectances of the at least part of the structure, wherein the average reflectances are indicative of the parameter at the plurality of times;
   and
   determining, based on the plurality of average reflectances, an estimation of the parameter at one or more further times.

2. The method according to clause 1, further comprising
   illuminating, at the one or more further times, the at least part of the structure with the electromagnetic radiation, the at least part of the structure being at a second orientation; and
   sensing, at the one or more further times, one or more further average reflectances of the at least part of the structure, wherein the further average reflectances are indicative of the parameter at the one or more further times.

3. The method according to clause 2, further comprising determining the estimation of the parameter based on the one or more further average reflectances.

4. The method according to any preceding clause, further comprising estimating the drift error based on the plurality of average reflectances.

5. The method according to any of clauses 2 to 4, wherein, in the second orientation, the at least part of the structure is rotated about a z-axis that is perpendicular to a plane of the substrate, the rotation being relative to a source of the electromagnetic radiation, and optionally wherein the rotation is one of 180 degrees and 90 degrees.

6. The method according to any of clauses 2 to 5, wherein determining the estimation of the parameter is further based on a total radiation dose associated with the illumination of the at least part of the structure at the first orientation, and a total radiation dose associated with the illumination of the at least part of the structure at the second orientation.

7. The method according to any of clause 2 to 6, where in the plurality of average reflectances and/or the further average reflectances comprise an integration of a radiation intensity over at least part of an illumination time.

8. The method according to any preceding clause, wherein determining the estimation of the parameter comprises determining a weighted average of the plurality of average reflectances.

9. The method according to clause 8 when dependent directly or indirectly on clause 2, wherein determining the estimation of the parameter comprises determining a weighted average of the plurality of further average reflectances.

10. The method according to clause 8 or 9, wherein weights applied when determining the weighted average are determined based on a time between illuminations of the at least part of the structure.

11. The method according to any preceding clause, wherein determining an estimation of the parameter comprises determining an estimation of target drift and/or an estimation of system drift based on the plurality of average reflectances.

12. The method according to any preceding clause, wherein illumination at the plurality of times comprises:

illumination, at a first time, of at least part of a first structure;

illumination, at a second time, of at least part of a second structure; and illumination, at a third time, of at least part of the first structure, wherein the plurality of average reflectances are indicative of the parameter at the first, second and third times.

13. The method according to clause 12, wherein determining an estimation of the system drift is based on a diffracted radiation intensity corresponding to illumination of the first structure at the first time and a diffracted radiation intensity corresponding to illumination of the second structure at the second time.

14. The method according to clause 12 or 13, wherein determining an estimation of the target drift is based on a diffracted radiation intensity corresponding to illumination of the first structure at the first time and a diffracted radiation intensity corresponding to illumination of the first structure at the third time.

15. The method according to any preceding wherein the electromagnetic radiation for illumination of the at least part of the structure in the first orientation comprises electromagnetic radiation in a first spectrum, and wherein the electromagnetic radiation for illumination of the at least part of the structure in the second orientation comprises electromagnetic radiation in a second spectrum.

16. A computer program product comprising instructions which, when executed on at least one processor, cause the at least one processor to control an apparatus to carry out a method according to any preceding clause.

17. An apparatus for determining a parameter of a structure fabricated in or on a substrate and compensated for a drift error, the apparatus comprising a computer processor configured to control the apparatus to undertake the method of:

illuminating, at a plurality of times, at least part of the structure with electromagnetic radiation, the at least part of the structure being at a first orientation;

sensing, at the plurality of times, a plurality of average reflectances of the at least part of the structure, wherein the average reflectances are indicative of the parameter at the plurality of times;

determining, based on the plurality of average reflectances, an estimation of the parameter at one or more further times.

18. A metrology tool comprising an apparatus according to clause 17.

19. A lithographic system comprising an apparatus according to clause 17.

20. A lithographic cell comprising an apparatus according to clause 17.

According to a specific arrangement disclosed herein, there is provided a method of determining a drift error in measurement of a parameter of a structure fabricated in or on a substrate, the method comprising: illuminating, at a plurality of times, at least part of the structure with electromagnetic radiation, the at least part of the structure being at a first orientation; sensing, at the plurality of times, a plurality of reflectance from the at least part of the structure, wherein the reflectances are indicative of the parameter at the plurality of times; and determining, based on the plurality of reflectances, an estimation of the drift error in measurement of the parameter at one or more further times. A corresponding apparatus is also disclosed.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference is made to SXR and/or EUV electromagnetic radiations, it will be appreciated that the invention, where the context allows, may be practiced with all electromagnetic radiations, includes radio waves, microwaves, infrared, (visible) light, ultraviolet, X-rays, and gamma rays. As an alternative to optical metrology methods, it has also been considered to use X-rays, optionally hard X-rays, for example radiation in a wavelength range between 0.01 nm and 10 nm, or optionally between 0.01 nm and 0.2 nm, or optionally between 0.1 nm and 0.2 nm, for metrology measurements.

The invention claimed is:

1. A method comprising:
   illuminating, a plurality of times, at least part of a structure in or on a substrate with electromagnetic radiation, the at least part of the structure being at a first orientation;
   sensing, at the plurality of times, a plurality of average reflectances of the at least part of the structure, wherein the plurality of average reflectances are indicative of a parameter of the structure at the plurality of times; and
   determining, based on the plurality of average reflectances, an estimation of the parameter of the structure at one or more further times.

2. The method of claim 1, further comprising:
   illuminating, at the one or more further times, the at least part of the structure with the electromagnetic radiation, the at least part of the structure being at a second orientation; and
   sensing, at the one or more further times, one or more further average reflectances of the at least part of the structure, wherein the one or more further average reflectances are indicative of the parameter of the structure at the one or more further times.

3. The method of claim 2, wherein the determining the estimation of the parameter of the structure is based on the one or more further average reflectances.

4. The method of claim 2, wherein:
   in the second orientation, the at least part of the structure is rotated about a z-axis that is perpendicular to a plane of the substrate, the rotation being relative to a source of the electromagnetic radiation, and
   the rotation is one of 180 degrees and 90 degrees.

5. The method of claim 2, wherein the determining the estimation of the parameter of the structure is further based on a total radiation dose associated with the illumination of the at least part of the structure at the first orientation, and a total radiation dose associated with the illumination of the at least part of the structure at the second orientation.

6. The method of claim 2, wherein the plurality of average reflectances and/or the one or more further average reflectances comprise an integration of a radiation intensity over at least part of an illumination time.

7. The method of claim 1, further comprising estimating a drift error based on the plurality of average reflectances.

8. The method of claim 1, wherein the determining the estimation of the parameter of the structure comprises determining a weighted average of the plurality of average reflectances.

9. The method of claim 8, wherein weights applied when determining the weighted average are determined based on a time between illuminations of the at least part of the structure.

10. The method of claim 1, wherein the determining the estimation of the parameter of the structure comprises determining a weighted average of the one or more further average reflectances.

11. The method of claim 1, wherein the determining the estimation of the parameter of the structure comprises determining an estimation of target drift and/or an estimation of system drift based on the plurality of average reflectances.

12. The method of claim 11, wherein the illuminating at the plurality of times comprises:
    illuminating, at a first time, at least part of a first structure;
    illuminating, at a second time, at least part of a second structure; and
    illuminating, at a third time, at least part of the first structure,
    wherein the plurality of average reflectances are indicative of the parameter of the structure at the first, second and third times.

13. The method of claim 12, wherein the determining the estimation of the system drift is based on a diffracted radiation intensity corresponding to illuminating the at least part of the first structure at the first time and a diffracted radiation intensity corresponding to illuminating the at least part of the second structure at the second time.

14. The method of claim 12, wherein the determining the estimation of the target drift is based on a diffracted radiation intensity corresponding to illuminating the at least part of the first structure at the first time and a diffracted radiation intensity corresponding to illuminating the at least part of the first structure at the third time.

15. The method of claim 1, wherein:
    the electromagnetic radiation for illuminating the at least part of the structure in the first orientation comprises electromagnetic radiation in a first spectrum, and
    the electromagnetic radiation for illuminating the at least part of the structure in the second orientation comprises electromagnetic radiation in a second spectrum.

* * * * *